United States Patent [19]
Mills

[11] Patent Number: 5,389,739
[45] Date of Patent: Feb. 14, 1995

[54] ELECTRONIC DEVICE PACKAGING ASSEMBLY

[75] Inventor: Louis T. Mills, Loveland, Colo.

[73] Assignee: Hewlett-Packard Company, Palo Alto, Calif.

[21] Appl. No.: 991,057

[22] Filed: Dec. 15, 1992

[51] Int. Cl.6 .......................................... H01L 23/02
[52] U.S. Cl. ................... 174/52.4; 257/666; 361/813
[58] Field of Search .............. 174/52.4, 52.1, 52.2, 174/52.3, 52.5, 52.6; 361/813; 29/840; 257/666, 668, 676, 678, 687, 701

[56] References Cited

U.S. PATENT DOCUMENTS

| | | | |
|---|---|---|---|
| 3,862,360 | 1/1975 | Dill et al. | 178/7.3 D |
| 4,395,585 | 7/1983 | Polcyn | 174/138 G |
| 4,470,648 | 9/1984 | Davis et al. | 339/14 R |
| 4,833,570 | 5/1989 | Teratani | 361/403 |
| 4,873,615 | 10/1989 | Grabbe | 361/395 |
| 4,897,508 | 1/1990 | Mahulikar et al. | 174/52.4 |
| 4,952,531 | 8/1990 | Cherukuri | 501/69 |
| 5,067,007 | 11/1991 | Kanji et al. | 357/74 |
| 5,092,034 | 3/1992 | Altendorfer | 29/840 |
| 5,157,480 | 10/1992 | McShane et al. | 174/52.4 X |
| 5,159,535 | 10/1992 | Desai et al. | 361/398 |
| 5,233,504 | 8/1993 | Melton et al. | 361/760 |

FOREIGN PATENT DOCUMENTS

WO91/07776 5/1991 WIPO.

*Primary Examiner*—Leo P. Picard
*Assistant Examiner*—Christopher Horgan

[57] ABSTRACT

An electronic device package assembly including a base member; a cover member; a lead frame having a plurality of leads disposed between the base member and the cover member; an electronic device disposed between the base member and the cover member and electrically attached to the leads; bonding rings for bonding the base member and the cover member to the lead frame; and spacers disposed between the lead frame and the base member and the lead frame and the cover member for maintaining the base member and the cover member at a predetermined spacing from the lead frame.

20 Claims, 4 Drawing Sheets

ELECTRONIC DEVICE PACKAGING ASSEMBLY

BACKGROUND

The present invention relates generally to electronic device packaging assemblies and, more particularly, to an electronic device packaging assembly having spacers for maintaining base and cover substrate portions of the package assembly in parallel relationship with a lead frame portion of the assembly.

In many electronics applications, it is necessary to house an electronic device such as an integrated circuit chip within a protective casing in order to protect the electronic device from the environment. Electronic device packages are disclosed in U.S. Pat. 4,897,508 of Mahulikar et al. which is hereby specifically incorporated by reference for all that it discloses.

A typical electronic device package assembly comprises a relatively flat lead frame having a plurality of leads terminating at an interior opening. The electronic device to be housed is positioned in alignment with the interior opening of the lead frame and is electrically attached to the interior terminal ends of the leads by connecting wires. The bottom portion of the lead frame is bonded by a ring of matrix material to a base substrate member and the top of the lead frame is bonded by a ring of matrix material to a cover substrate member. The electronic device is thus maintained within an enclosure defined by the base substrate member, the cover substrate member, and the two rings of matrix material. The base substrate and cover substrate are generally of the same size and shape and are aligned with one another. The leads of the lead frame extend radially outwardly between the two rings of bonding material, typically to a position beyond the outer periphery of the base and cover substrate members. The exposed outer ends of the leads enable the electronic device to be electrically connected to other components.

During the formation of such an integrated circuit package, the bonding material is typically applied in a viscous liquid form, one ring at a time, with heat curing steps following each application of bonding material. In many applications, the electronic device package assembly must be constructed within precise tolerances. One problem experienced in the construction of such electronic package assemblies is that due to the lack of rigidity in the bonding rings during assembly, it is difficult to maintain the base and cover components in exact parallel alignment.

As a result of this problem, holding fixtures have been developed which employ a machine spacer to hold the base and cover substrates in parallel alignment during fabrication. However, a problem with this solution is that the holding fixtures are relatively expensive to produce and are cumbersome in operation. A further problem is that the holding fixtures does not hold the central plane of the lead frame in parallel alignment with the base and cover plates. As a result of this non-parallelism of the lead frame, some of the outer lead terminals are positioned nearer to the base member and others of the outer lead terminals are positioned closer to the cover member. A package assembly thus constructed is often rejected during an initial testing for accuracy of dimensional parameters due to the misalignment of the lead frame with the base and cover members. Even if the package assembly passes the initial dimension testing, it is likely to fail subsequent electrical testing because of uneven contact with electrical test sockets. Furthermore, misalignment of the lead frame with the base and cover member may cause some of the leads to be bumped during handling causing the leads to be further misaligned or damaged. As a result, the assembly may fail further electrical testing or may cause a failure of an associated circuit board, etc., when the device is mounted for use in its intended application.

Thus, a need exists for an electronic device package assembly which may be constructed with the base plate, the cover plate, and the central plane of the lead frame located in parallel alignment. The method by which such an assembly is constructed should preferably be cost efficient and relatively easy to implement.

SUMMARY OF THE INVENTION

The present invention is directed to an electronic device package assembly in which the base substrate, the cover substrate, and the central plane of the lead frame are positioned in precise parallel alignment by the use of spacers provided in the package assembly itself. The invention also pertains to a method for producing such an electronic device package assembly.

The invention may thus comprise an electronic device package assembly which includes an electronic device which is attached to a central portion of a relatively flat lead frame. A lower surface of the lead frame is initially bonded by a ring of matrix material applied between a lower surface portion of the lead frame and a top surface portion of the base member. The matrix material is typically applied first to the base member and the lead frame is subsequently positioned onto the matrix material in overlying relationship with the base member. Spacers are provided between the lead frame lower surface and the base member upper surface. In one embodiment, the spacers are formed by producing a downwardly extending "bump" or "bubble" in the lead frame by appropriate tooling at the time that the lead frame is initially stamped out and in another embodiment, the spacer is provided by a downwardly bent tab portion of the lead frame. In another embodiment, the spacer is provided by building up a "boss" on the upper surface of the base member in yet another embodiment, "free" spacers are provided which are not attached to either the base member or the lead frame in which case the spacers must be precisely located prior to bonding. An integral spacer frame attached to such "free" spacers could be employed to facilitate placement of free spacers. In each embodiment, at least three and preferably four such spacers are provided so as to maintain the central plane of the lead frame in precise parallel alignment with the plane of the base member.

Next, a lower planar surface of the cover member is adhered to the top surface of the lead frame by a second ring of bonding matrix. Spacers are provided between the upper surface of the lead frame and the lower surface of the cover member so as to position the cover member in precise parallel alignment with the central plane of the lead frame. External force is applied to the base member and cover member to insure contact between the cover member, lead frame and base member with the associated spacers prior to curing of the bonding matrix. In a typical embodiment, the bonding matrix may be epoxy which is heat cured by conventional methods.

Thus, the invention may comprise an electronic device package assembly comprising a base member; a cover member; a lead frame having a plurality of leads disposed between the base member and the cover member; an electronic device disposed between the base member and the cover member and electrically attached to the leads; bonding means for bonding the base member and the cover member to the lead frame; and spacer means disposed between the lead frame and the base member and the lead frame and the cover member for maintaining the base member and the cover member at a predetermined spacing from the lead frame.

The invention may also comprise a method of forming an electronic package of the type having an electronic device disposed between a base member and a cover member comprising the steps of: forming a lead frame; providing spacers between the lead frame and at least one of the members so as to maintain the lead frame and the at least one member at a predetermined spacing; and bonding the at least one member to the lead frame.

The invention may also comprise an electronic device package assembly comprising: a base member having a planar surface portion and an outer periphery; a cover member having a planar surface portion and an outer periphery, the cover member being aligned and generally coextensive with the base member, the planar surface portion of the cover member being positioned parallel to the planar surface portion of the base member; a lead frame having a first surface portion and an opposing second surface portion and having a plurality of leads extending radially between an outer peripheral portion of the lead frame and an inner peripheral portion of the lead frame, the inner peripheral portion of the lead frame defining a central lead frame opening, the lead frame being disposed between the base member and the cover member with the outer peripheral portion of the lead frame extending beyond the outer peripheries of the base member and the cover member; the lead frame comprising integrally formed spacer means extending axially outwardly from the first and second surface portions of the lead frame into contacting engagement with the planar surface portions of the base member and the cover member for maintaining the planar surface portions of the base member and the cover member in parallel relationship; an electronic device disposed between the base-member and the cover member in alignment with the central lead frame opening and electrically attached to the leads; first bonding means positioned generally concentrically of the central lead frame opening and in contact with the spacer means projecting from the first surface portion of the lead frame for bonding the base member planar surface portion to the first surface portion of the lead frame; and second bonding means positioned generally concentrically of the central lead frame opening and in contact with the spacer means projecting from the second surface portion of the lead frame for bonding the cover member planar surface portion to the second surface portion of the lead frame.

BRIEF DESCRIPTION OF THE DRAWING

Illustrative and presently preferred embodiments of the invention are shown in the accompanying drawings in which.

DETAILED DESCRIPTION OF THE INVENTION

Figure 1:
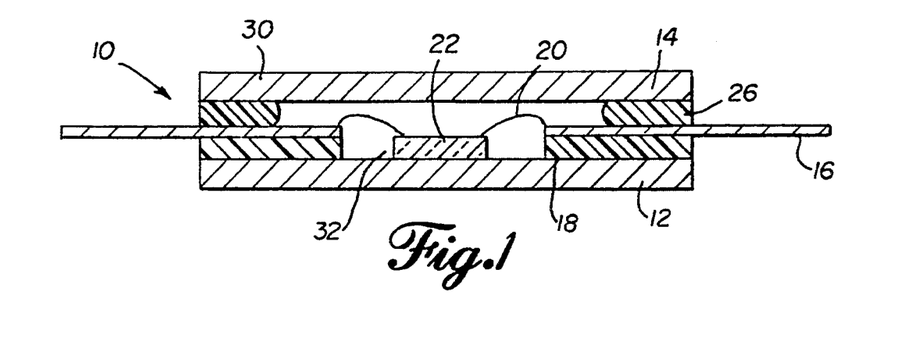
FIG. 1 is a cross-sectional elevation view of a prior art electronic device package assembly.

FIG. 1 is a cross-sectional representation of a prior art housing 10 for encapsulating an electronic device 22. The typical method of manufacture is to fasten the lead frame 16 to the base component 12 using a first sealant 28. The first sealant is generally a low melting solder glass or a polymer adhesive. A typical solder glass for use in sealing electronic packages is a lead borate glass matrix usually containing one or more other glass components. One example of a solder glass is the mixture 75%–85% PbO, 0.5%–16% ZnO and 8%–15% $B_2O_3$. Any solder glass with an appropriate coefficient of thermal expansion may be utilized. A typical polymer sealant is a heat curable epoxy such as novalac.

A typical sealing profile for a solder glass is about 410 degrees–430 degrees C. for 10 minutes and for an epoxy a typical curing cycle is about 150 degrees to 170 degrees C. for about 30 to 120 minutes.

After the first sealant is cured and the lead frame affixed in place, the electronic device 22, often a silicon based semiconductor chip, is attached. The electronic device is attached either directly to the base component 12 by a die attach 32 or to a buffer (not shown) which is then fastened to the base component. A buffer system is disclosed in U.S. patent application Ser. No. 826,808 filed Feb. 10, 1986, by Pryor et al.

The coefficient of thermal expansion of the base component or buffer determines the choice of die attach material 32 used. If the CTE of the base component or buffer is within about 10% the CTE of the electronic device, typically $49 \times 10^{-7}$, a hard solder such as 98% Au/2% SI may be used. If the CTE of the base component or buffer does not approach that of the electronic device, a more forgiving die attach is used. For example, a soft solder such as 95% Pb/5% Sn or an electrically conductive polymer adhesive such as a silver filled epoxy may be used.

A thermal treatment is required to activate the die attach. If Au/Si solder is used this thermal treatment generally is about 420 degrees C. for about 5 seconds. For Pb/Sn solder, a temperature of about 200 degrees C. for about 20 seconds is used and for the filled polymer about 150 degrees Cs for about 30 minutes. Regardless of the die attach chosen, the first sealant 28 is subjected to a second heating and cooling cycle.

The lead wires 20 are next bonded to the electronic device 22 and inner lead portions 18 to electrically connect the electronic device to the outside world through lead frame 16. The lead wires are typically gold or aluminum wires or thin strips of copper foil if the process known as tape automated bonding (TAB) is used. Bonding may be ultrasonic welding, thermal bonding or thermal compression bonding. Some heat of bonding may be transmitted through the leads subjecting the first sealant 28 to another thermal cycle. A typical bonding temperatures is about 240 degrees C. for about 5 seconds.

Next, a second sealant 26 is applied to the cover component 14. The second sealant, is usually chosen to have the same composition as the first sealant 28 to insure chemical compatibility although this is not necessary as disclosed in previously cited U.S. Pat. No. 4,704,626. The cover component 14 is then positioned adjacent to the lead frame 16 and bonded to the side of the lead frame opposite the base component. A sealing profile suitable to cure the second sealant 26 is required. The first sealant 28 is once more subjected to a thermal cycle.

Figure 2:
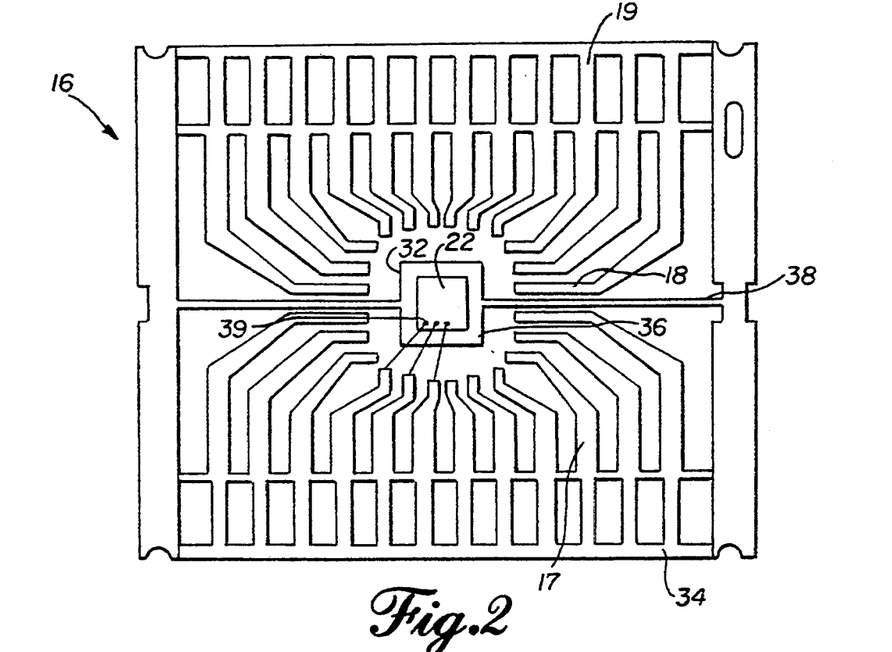
FIG. 2 is a top plan view of a prior art electronic device package assembly.
Figure 3:
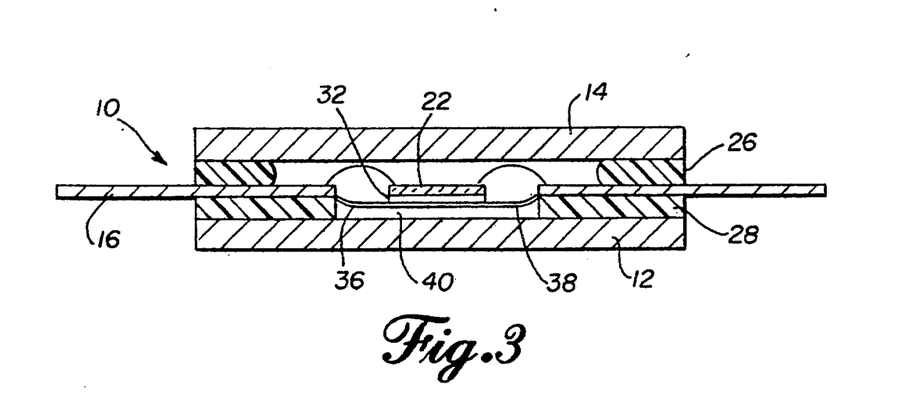
FIG. 3 is a cross-sectional elevation view of the prior art electronic device package assembly of FIG. 3.

FIGS. 2 and 3 illustrate the assembly of a housing 10 for an electronic device 22 of another prior art embodiment.

Referring to FIG. 2, a schematic of a lead frame 16 as known in the art is shown. The lead frame 16 is comprised of an electrically conductive material. Lead frames are typically fashioned from Alloy 42 (an iron-nickel alloy containing 58% Fe and 42% Ni), KOVAR (an iron-nickel-cobalt alloy containing 54% Fe, 29%Ni and 17% Co), copper a copper based alloy. The lead frame may be plated or clad with a second material to enhance bonding to the sealant, improve corrosion resistance or improve-appearance. Typically, the lead frame for a metal package is a copper based alloy such as C638 described-in U.S.. Pat. Nos. 3,341,369 and 3,475,227 to Caule et al. or C724 as described in U.S. Pat. No. 4,594,221 to Caron et al. Alloys C638, C724, C7025 and similar copper based alloys form a refractory oxide layer which facilitates bonding of the alloy to a solder glass. Alternatively, dilute copper alloys, essentially pure copper with trace amounts of additives, are also used as lead frames due to the high electrical conductivity they impart as compared to other copper alloys and added strength they have compared to purse copper. A typical dilute copper alloy for use in lead frames is C194 (2.35 percent F3, 0.03% P.O.12 percent Zn and the balance Cu). The lead frame is comprised of lead fingers 17 which are made up of inner lead portions 18 for bonding to the electronic device 22 and outer lead portions 19 for electrically connecting the electronic device to an external device, for example, by insertion into a printed circuit board. The lead frame also contains tie bars 34 to support the lead fingers 17 during assembly operations. The tie bars 34 are generally severed once the lead frame is in place to electrically isolate the leads from each other. Some lead frames also contain a centrally positioned die attach pad 36 which is connected to the tie, bars by die attach pad supports 38. Lead frames with die attach pads are usually used in plastic encapsulated packages to provide a site to mount the chip and provide electrical contact to the back side of the chip.

The electronic device package assemblies described above with reference to FIGS. 1-3 are disclosed in U.S. Pat. No. 4,897,508 for METAL ELECTRONIC PACKAGE of Mahulikar et al. which is hereby specifically incorporated by reference for all that it discloses.

The electronic device package assembly of the present invention may have the same features as those described-above with references to FIGS. 1-3, except that spacers are provided between the base member and the lead frame and also, between the cover member and the lead frame so as to maintain the planes of the lead frame, the base member and cover member in parallel alignment.

Figure 4:
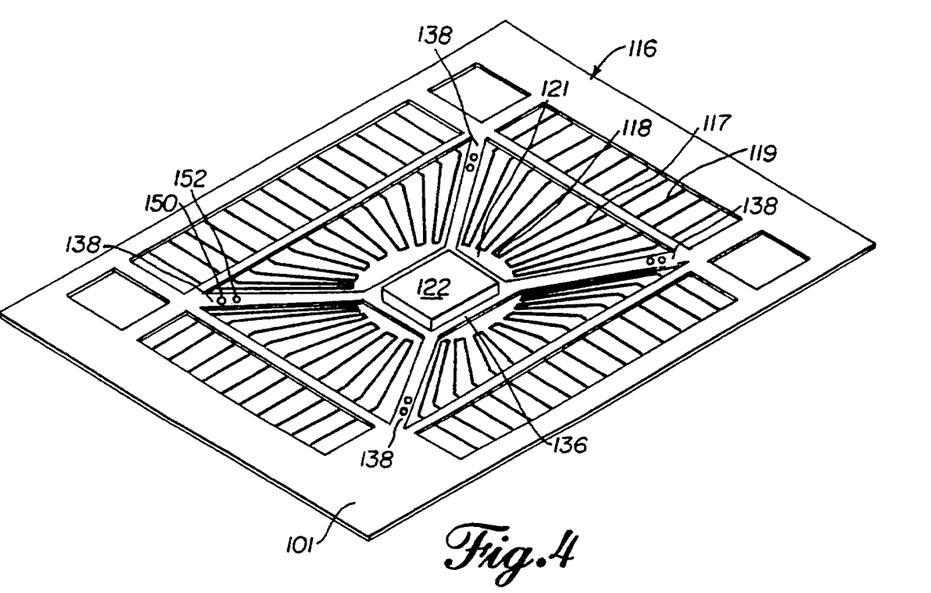
FIG. 4 is a top perspective view of a lead frame having spacer bubbles formed therein.
Figure 5:
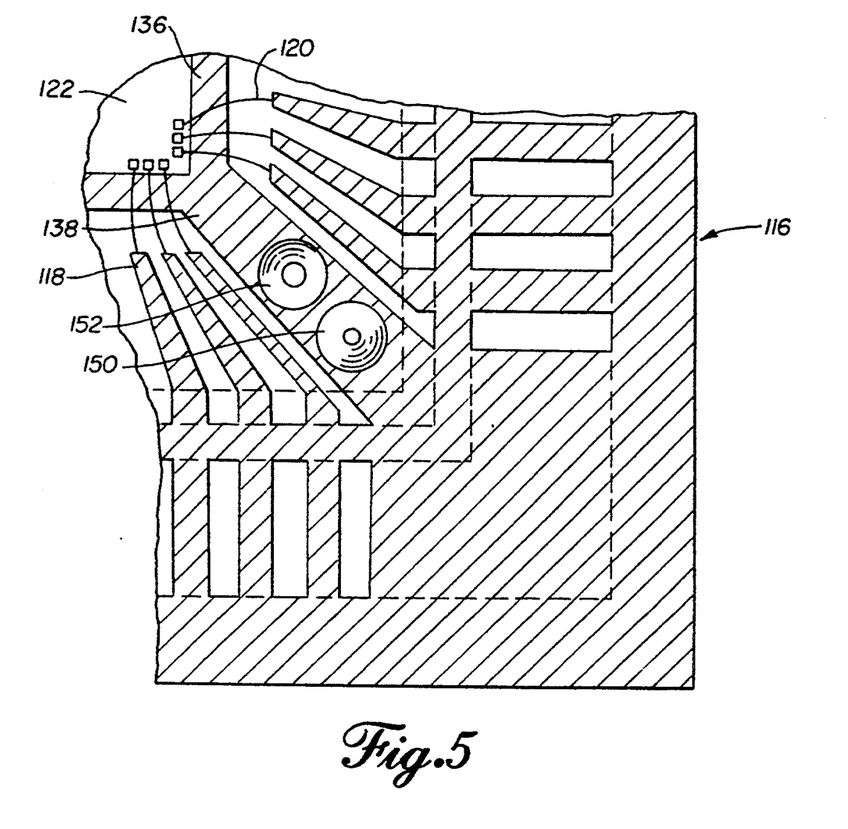
FIG. 5 is a detailed top plan view of a portion of the lead frame of FIG. 4.
Figure 6:
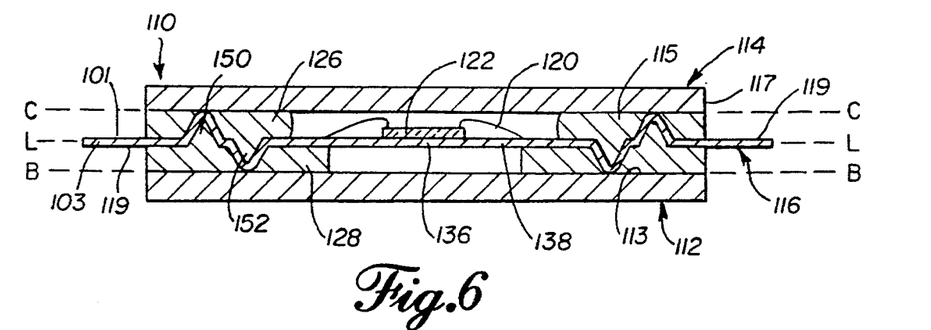
FIG. 6 is a side elevation view of an electronic device package assembly formed using the lead frame of FIG. 4.

FIGS. 4-6 illustrate one preferred embodiment of the invention comprising a lead frame 116 having a plurality of radially extending leads 117 extending between interperipheral ends 118 and outer peripheral ends 119. The inner lead ends 118 define a central lead frame opening 121. A support pad 136 is positioned within opening 121 and is adapted to support an electronic device 122 thereon. The support pad 136 is attached through support pad arms 138 to the outer periphery of the lead frame 116. Although illustrated as a planar extension of the lead frame in FIG. 6, the support may extend downwardly in the same manner as illustrated in FIG. 3. The support pad arms may be provided at four corner regions of the support pad 136. An upwardly extending bubble 150 and a downwardly extending bubble 152, as beast shown in FIG. 5, are provided in each of the support pad arms 138 at the same distance from the center of the lead frame 116. FIG. 6 illustrates an electronic device package assembly 110 which incorporates the lead frame 116. The packaging assembly comprises a base member 112 having a planar surface portion 113 defining plane BB and having an outer peripheral edge 111. The electronic device package assembly 110 also comprises a cover member 114 having a planar surface portion 115 defining plane CC and having an outer periphery 117. The cover member 114 may be of the same size and shape as the base member and may be directly aligned with the base member, i.e., positioned in overlying relationship with the base member. The planar surface portion 115 of the cover member is positioned parallel to the planar surface portion 113 of the base member. Lead frame 116 has a first surface portion 101 and an opposing second surface portion 103 and has a central lead frame plane LL. The lead frame is disposed between the base member 112 and the cover member 114 with the outer peripheral portion of the lead frame 119 extending beyond the outer peripheries 111, 117 of the base member and the cover member. The lead frame comprises integrally formed space remains 150, 152 extending axially outwardly from the first and second, service portions 101, 103 of the lead frame into contacting engagement with the planar surface portions 115, 113 of the cover member 114 and base member 112, respectively. The spacer means maintain the planar surface portions of the base member 112 and cover member 114 in parallel relationship and also maintain the central plane LL of the lead frame in parallel relationship with the planar surface portions of the base member and cover member. In the embodiment illustrated in FIGS. 4-6, the spacer means comprise bubble-up and bubble-down portions 150, 152 of the lead frame support arm members 138. The bubble-up and bubble-down configurations-may be formed in a die-stamping operation at the same time the lead portions, etc. of the lead frame are formed. Alternatively, the "bubble-up", "bubble-down" configurations could be formed in a separate die press operation in the illustrated embodiment four bubble-up and four bubble-down configurations are provided. It will be appreciated by those having skill in the art that a planar alignment between the lead frame and an associated spaced member could be provided with only three spacers since the three contact points provided by the spacers define a plane. It will also be appreciated that more than four spacers may be provided between a lead frame and an associated spaced member.

Although the bump configurations are shown to have been formed in the support arms 138, it will also be appreciated by those having skill in the art, that a lead might also be provided with bubble-up, bubble-down configurations to achieve the same result. In situations in which the base member and cover member are conductive members, the lead used to form the spacers would not be electrically connected to the connecting pad regions of the associated electronic device.

Figure 7:
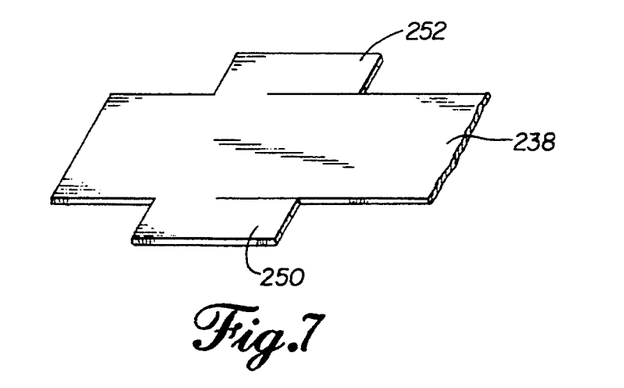
FIG. 7 is a detail perspective view of a portion of a lead frame having tab portions formed therein.
Figure 8:
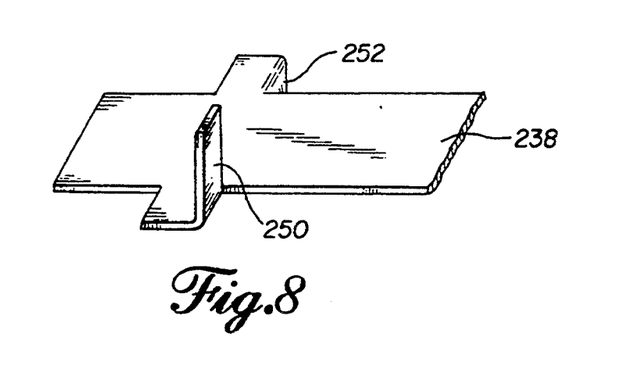
FIG. 8 is a detail perspective view of the lead frame portion of FIG. 7 showing the tab portions bent in an upward configuration and a downward configuration so as to provide spacers.

FIG. 7 illustrates a portion of a support arm portion of a lead frame such as 138 illustrated in FIG. 4 wherein tab regions 250, 252 have been cut out at the time of formation of the lead frame. These tab portions 50, 252 are subsequently bent upwardly and downwardly, respectively, so as to form spacers which serve the same function as the bubble-up, bubble-down spacers described above. The bending of the tabs into upward and downward positions may be achieved in a separate die press forming operation.

Figures 9, 10, 11:
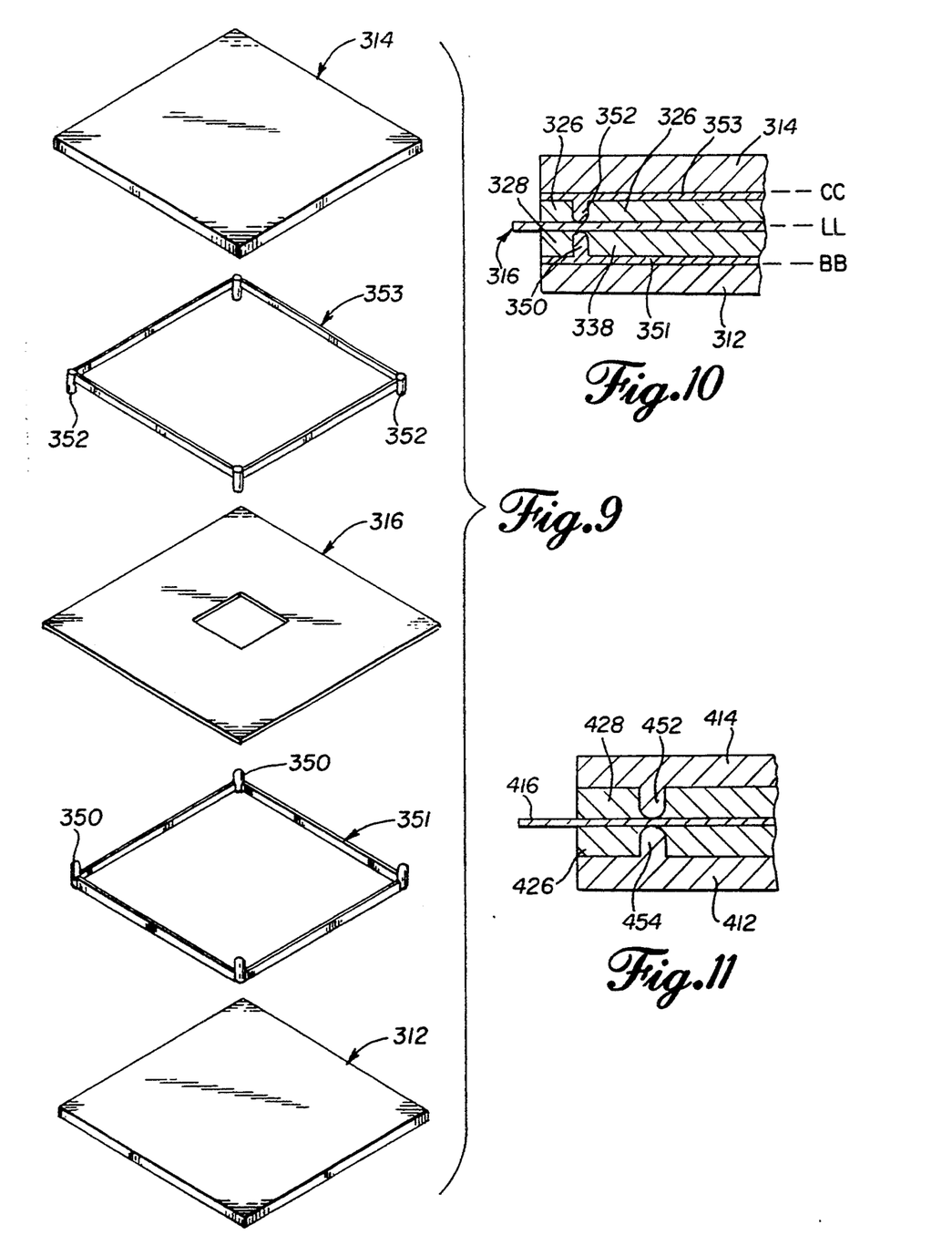
FIG. 9 is an exploded perspective view of portions of an electronic device package including two spacer frames.
FIG. 10 is a cross-sectional elevation view of a portion of an electronic device package assembly which includes two spacer frames.
FIG. 11 is a cross-sectional elevation view of a portion of an electronic device package assembly having spacers formed in a base member and in a cover member.

FIGS. 9 and 10 illustrate an embodiment of the invention in which separate up spacers 350 are provided on an up spacer frame 351 and four down spacers 352 are provided on a down spacer frame 353. Although in FIG. 10 the holding frames, 351, 353 are shown in contact with the adjacent members 312, 314, the holding frame may also be constructed so that all portions thereof, except for the spacer, are spaced from the adjacent member and lead frame to enable the bonding matrix to flow around the intermediate portions of the spacer frame. The up spacer frame is positioned on base substrate member 312 in centered relationship therewith and a bonding ring 338, such as epoxy, is then applied to the base member 312. Thereafter, a lead frame 316 which may be identical to the lead frame described in FIG. 3 above, is positioned in overlying relationship with the cover member and pressed into contact with the up spacers 350. Next, spacer frame 353 is precisely located on cover member 314 and a bonding adhesive is applied thereto. Next, the assembly comprising the base member, spacer up frame and lead frame are urged against the down spacer 352 and are precisely aligned with the cover member. Next, the entire assembly is fired in a furnace to cure both bonding layers 338, 326 at once. As an alternative, bonding layer 338 may be cured in a separate curing step prior to attachment of the cover plate to the lead frame. As with prior described embodiments of the invention, the spacer arrangement is such as to provide parallel spacing between the planes BB, CC and LL of the base member, cover member and lead frame.

FIG. 11 illustrates an embodiment of the invention, in which a base member 412 is formed with up spacers 454 provided in upstanding relationship from an upper surface thereof and in which down spacers 452 are provided in downwardly extending relationship from a lower surface of a cover member 414. These spacers 452, 454 may be integrally formed with the associated members or may be separately formed from materials different from that of the cover member and base member. In the illustrated embodiment, the lead frame 416 is contacted at its upper surface by spacer 452 and at its lower surface by spacer 454. At least three spacers identical to spacer 452 are provided and at least three spacers identical to spacer 454 are provided. Bonding layers 426, 428 bond the base member and cover member to the lead frame in parallel relationship therewith.

In a further alternative embodiment (not shown), separate spacer members are attached either to the cover member and base member of to the lead frame by spot welding or other attachment means and provide the same spacing function as described above.

It is contemplated that the inventive concepts herein described may be variously otherwise embodied and it is intended that the appended claims be construed to include alternative embodiments of the invention except insofar as limited by the prior art.

What is claimed is:

1. An electronic device package assembly comprising:
   a base member;
   a cover member;
   a lead frame having a plurality of leads disposed between said base member and said cover member;
   an electronic device disposed between said base member and said cover member and electrically attached to said leads;
   bonding means for bonding said base member and said cover member to the lead frame, said bonding means being constructed from material having a liquid state under certain temperature conditions associated with assembly of said electronic device package assembly;
   spacer means disposed between said lead frame and said base member and said lead frame and said cover member for maintaining said base member and said cover member at a predetermined spacing from said lead frame, said spacer means being constructed from material having a solid state under all temperature conditions associated with assembly of said electronic device package assembly whereby said spacer means maintains said base member and said cover member at said predetermined spacing from said lead frame during periods when said bonding means is in a liquid state.

2. An electronic device package assembly comprising:
   a base member;
   a cover member;
   a lead frame having a plurality of leads disposed between said base member and said cover member;
   an electronic device disposed between said base member and said cover member and electrically attached to said leads;
   bonding means for bonding said base member and said cover member to the lead frame, said bonding means being constructed from material having a liquid state under certain temperature conditions associated with assembly of said electronic device package assembly;
   spacer means disposed between said lead frame and said base member and said lead frame and said cover member for maintaining said base member and said cover member at a predetermined spacing from said lead frame, said spacer means being constructed from material having a solid state under all temperature conditions associated with assembly of said electronic device package assembly whereby said spacer means maintains said base member and said cover member at said predetermined spacing from said lead frame during periods when said bonding means is in a liquid state, and said spacer means comprising an integrally formed portion of said lead frame.

3. The invention of claim 2 said spacer means comprising bubbled-out portions of said lead frame.

4. The invention of claim 2 said spacer means comprising prong portions of said lead frame.

5. The invention of claim 1 said spacer means comprising at least one spacer structure separately formed from said lead frame.

6. The invention of claim 5 said spacer structure comprising structure fixedly bonded to at least one of said members.

7. An electronic device package assembly comprising:
   a base member;
   a cover member;
   a lead frame having a plurality of leads disposed between said base member and said cover member;
   an electronic device disposed between said base member and said cover member and electrically attached to said leads;
   bonding means for bonding said base member and said cover member to the lead frame, said bonding means being constructed from material having a liquid state under certain temperature conditions associated with assembly of said electronic device package assembly;
   spacer means disposed between said lead frame and said base member and said lead frame and said cover member for maintaining said base member and said cover member at a predetermined spacing from said lead frame, said spacer means being constructed from material having a solid state under all temperature conditions associated with assembly of said electronic device package assembly whereby said spacer means maintains said base member and said cover member at said predetermined spacing from said lead frame during periods when said bonding means is in a liquid state, and said spacer means being circumscribingly contacted by said bonding means.

8. The invention of claim 1, said spacer means being constructed and arranged such that said base member and said cover member are positioned in substantially parallel relationship.

9. The invention of claim 2 said spacer means comprising at least one spacer member formed separately from said lead frame and said base and cover members.

10. A method of forming an electronic package of the type having an electronic device disposed between a base member and a cover member comprising the steps of:
    forming a lead frame;
    positioning spacers between the lead frame and at least one of the members so as to maintain the lead frame and the at least one member at a predetermined spacing; and
    bonding the at least one member to the lead frame while maintaining the spacers in a solid state.

11. The method of claim 10 wherein the step of positioning spacers comprises positioning spacers between the lead frame and the base member and positioning spacers between the lead frame and the cover member and wherein the step of bonding comprises bonding opposing surfaces of the lead frame to the base member and cover member, respectively.

12. A method of forming an electronic package of the type having an electronic device disposed between a base member and a cover member comprising the steps of:
    forming a lead frame;
    positioning spacers between the lead frame and at least one of the members so as to maintain the lead frame and the at least one member at a predetermined spacing; and
    bonding the at least one member to the lead frame while maintaining the spacers in a solid state, wherein the step of forming the lead frame comprises forming the spacers from portions of the lead frame.

13. The method of claim 12 wherein the method of forming the spacer comprises forming bubbled-out portions in the lead frame.

14. The method of claim 13 wherein the method of forming the spacers comprises forming prong portions in the lead frame.

15. The method of claim 10 wherein the step of positioning spacers comprises forming a spacer structure on at least one of the members.

16. The method of claim 10 wherein the step of positioning spacers comprises positioning a separate spacer structure between the lead frame and at least one member.

17. A method of forming an electronic package of the type having an electronic device disposed between a base member and a cover member comprising the steps of:
    forming a lead frame;
    positioning spacers between the lead frame and at least one of the members so as to maintain the lead frame and the at least one member at a predetermined spacing; and
    bonding the at least one member to the lead frame while maintaining the spacers in a solid state, wherein the step of bonding the at least one member to the lead frame comprises applying a bonding matrix in circumscribing contact with said spacers.

18. An electronic device package assembly comprising:
    a base member having a planar surface portion and an outer periphery;
    a cover member having a planar surface portion and an outer periphery, said cover member being aligned and generally coextensive with said base member, said planar surface portion of said cover member being positioned-parallel to said planar surface portion of said base member;
    a lead frame having a first surface portion and an opposing second surface portion and having a plurality of leads extending radially between an outer peripheral portion of the lead frame and an inner peripheral portion of the lead frame, said inner peripheral portion of said lead frame defining a central lead frame opening, said lead frame being disposed between said base member and said cover member with said outer peripheral portion of said lead frame extending beyond said outer peripheries of said base member and said cover member;
    said lead frame comprising integrally formed spacer means extending axially outwardly from said first and second surface portions of said lead frame into contacting engagement with said planar surface portions of said base member and said cover member for maintaining said planar surface portions of said base member and said cover member in parallel relationship;

an electronic device disposed between said base member and said cover member in alignment with said central lead frame opening and electrically attached to said leads;

first bonding means positioned generally concentrically of said central lead frame opening and in contact with said spacer means projecting from said first surface portion of said lead frame for bonding said base member planar surface portion to said first surface portion of said lead frame; and second bonding means positioned generally concentrically of said central lead frame opening and in contact with said spacer means projecting from said second surface portion of said lead frame for bonding said cover member planar surface portion to said second surface portion of said lead frame.

19. The invention of claim 18, said spacer means comprising portions of said lead.

20. The invention of claim 18, said lead frame comprising a support pad portion positioned in supporting engagement with said electronic device and having radially extending arms attaching said support pad portion to said outer peripheral portion of said lead frame said spacer means comprising portions of said support pad portion.

* * * * *

UNITED STATES PATENT AND TRADEMARK OFFICE
CERTIFICATE OF CORRECTION

PATENT NO. : 5,389,739
DATED : Feb. 14, 1995
INVENTOR(S) : Louis T. Mills

It is certified that error appears in the above-identified patent and that said Letters Patent is hereby corrected as shown below:

Column 10, line 48, Claim 18: "abase" should read --a base--.

Column 10, line 54, Claim 18: After "positioned" delete "-".

Signed and Sealed this

Fourteenth Day of April, 1998

*Attest:*

BRUCE LEHMAN

*Attesting Officer*     *Commissioner of Patents and Trademarks*